US012633940B2

(12) United States Patent
Hsieh et al.

(10) Patent No.: US 12,633,940 B2
(45) Date of Patent: May 19, 2026

(54) CONTINUOUS-TIME ΔΣ ANALOG-TO-DIGITAL CONVERTER WITH DUTY-CYCLE-CONTROLLED INPUT PATH

(71) Applicant: QUALCOMM Incorporated, San Diego, CA (US)

(72) Inventors: Chieh-Yu Hsieh, Irvine, CA (US); Yuhua Guo, San Diego, CA (US); Dinesh Jagannath Alladi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 105 days.

(21) Appl. No.: 18/630,959

(22) Filed: Apr. 9, 2024

(65) Prior Publication Data

US 2025/0317152 A1 Oct. 9, 2025

(51) Int. Cl.
H03M 1/00 (2006.01)
H03M 3/00 (2006.01)
(52) U.S. Cl.
CPC .................................... H03M 3/49 (2013.01)
(58) Field of Classification Search
CPC ...................................................... H03M 3/49

USPC .......................................................... 341/126
See application file for complete search history.

(56) References Cited

U.S. PATENT DOCUMENTS

| | | | | |
|---|---|---|---|---|
| 6,710,728 B2 * | 3/2004 | Gude | .................... | H03M 3/368 |
| | | | | 341/143 |
| 10,886,933 B1 * | 1/2021 | Ghosh | .................. | H03M 1/164 |
| 11,770,109 B2 * | 9/2023 | Hancioglu | .......... | H03F 3/45968 |
| | | | | 330/10 |
| 2025/0247105 A1 * | 7/2025 | Zhong | .................. | H03M 1/462 |

FOREIGN PATENT DOCUMENTS

| | | | | | |
|---|---|---|---|---|---|
| CN | 101667834 | * | 3/2010 | ............. | H03M 3/00 |
| EP | 2408113 | * | 6/2013 | ............. | H03M 3/02 |

* cited by examiner

*Primary Examiner* — Jean B Jeanglaude
(74) *Attorney, Agent, or Firm* — Loza & Loza, LLP

(57) ABSTRACT

A delta-sigma analog-to-digital converter is provided that includes a continuous-time integration stage having an input terminal coupled through a switch to an input resistor that in turn couples to an input signal node. A feedback digital-to-analog converter converts a digital output signal to form a feedback current that also couples to the input terminal. A controller switches the first switch responsive to a duty cycle of the feedback current.

20 Claims, 6 Drawing Sheets

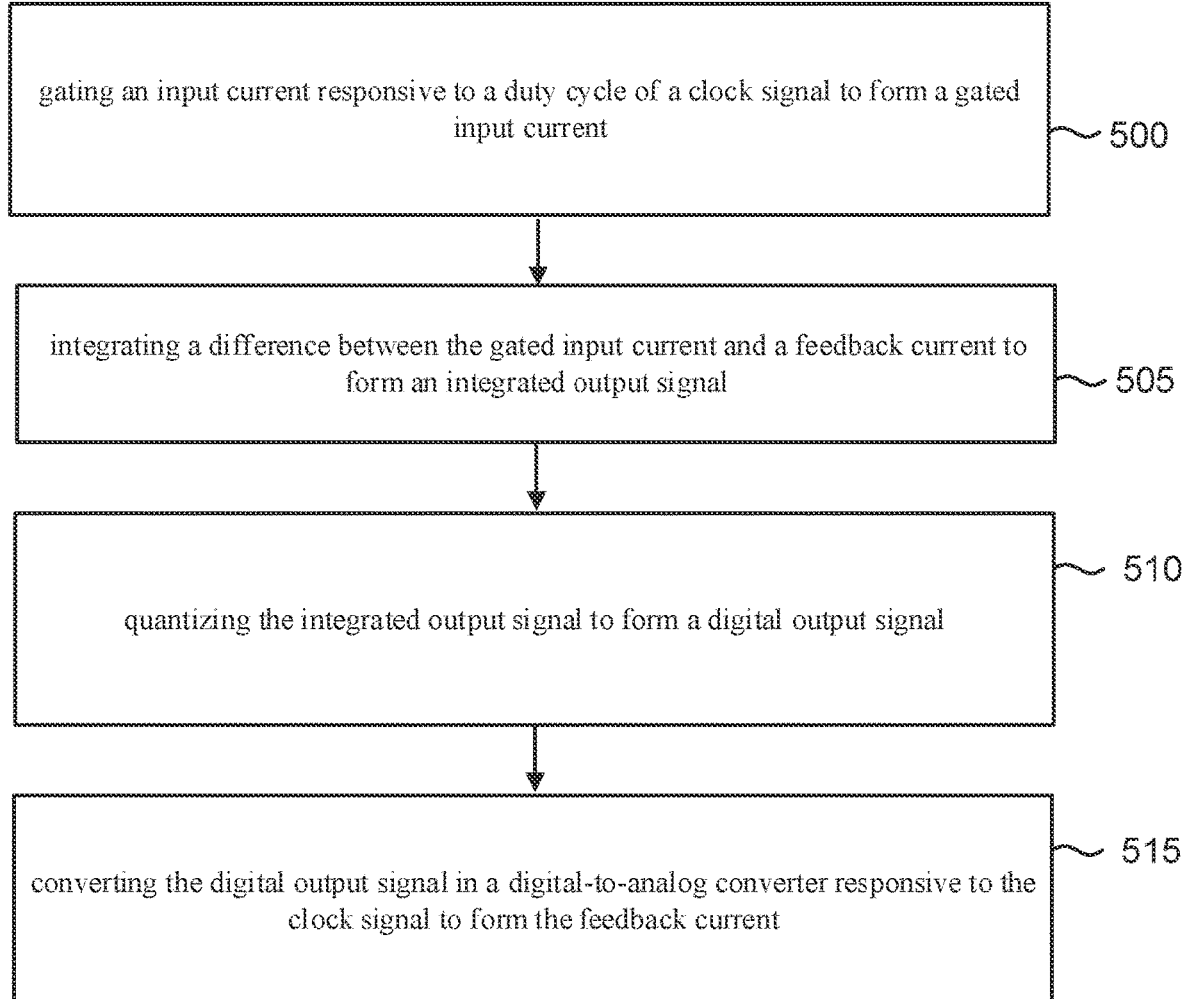

gating an input current responsive to a duty cycle of a clock signal to form a gated input current ~ 500 integrating a difference between the gated input current and a feedback current to form an integrated output signal ~ 505 quantizing the integrated output signal to form a digital output signal ~ 510 converting the digital output signal in a digital-to-analog converter responsive to the clock signal to form the feedback current ~ 515

FIG. 5

CONTINUOUS-TIME ΔΣ ANALOG-TO-DIGITAL CONVERTER WITH DUTY-CYCLE-CONTROLLED INPUT PATH

TECHNICAL FIELD

The present application relates generally to analog-to-digital converters, and more specifically to a continuous-time delta-sigma analog-to-digital converter with a duty-cycle-controlled input path.

BACKGROUND

Analog-to-digital converters may be classified depending upon the correspondence between input and output samples. In a Nyquist-rate analog-to-digital converter (ADC) there is a one-to-one correspondence between an input sample and the corresponding output sample. In contrast, there is at least a two-to-one correspondence between the input samples and the output samples in an oversampling ADC. Due to matching limitations and other issues, the effective number of bits for Nyquist-rate ADCs is limited as compared to oversampling ADCs. An oversampling ADC such as a delta-sigma (ΔΣ) ADC is thus a popular choice for applications such as microphones that requires a large dynamic range.

SUMMARY

In accordance with an aspect of the disclosure, an analog-to-digital converter is provided that includes: an input signal node for an analog input signal; a continuous-time integration stage including a first input terminal; an input resistor coupled to the input signal node; a first switch coupled between the input resistor and the first input terminal; a return-to-zero digital-to-analog converter configured to pulse a feedback current to the first input terminal; and a controller configured to switch the first switch responsive to an integration pulse width of the feedback current.

In accordance with another aspect of the disclosure, a method of tuning an analog-to-digital converter is provided that includes: an input signal node for an analog input signal; a continuous-time integration stage including a first input terminal; an input resistor coupled to the input signal node; a first switch coupled between the input resistor and the first input terminal; a capacitive digital-to-analog converter configured to transiently pulse a feedback current to the first input terminal during an integration pulse width of a clock signal; and a controller configured to switch the first switch on during an off time of the clock signal and to switch the first switch off during the integration pulse width.

Finally, in accordance with yet another aspect of the disclosure, method of digitizing an analog input signal is provided that includes: gating an input current responsive to a duty cycle of a clock signal to form a gated input current; integrating a difference between the gated input current and a feedback current to form an integrated output signal; quantizing the integrated output signal to form a digital output signal; and converting the digital output signal in a digital-to-analog converter responsive to the clock signal to form the feedback current.

These and other advantageous features may be better appreciated through the following detailed description.

BRIEF DESCRIPTION OF THE DRAWINGS

FIG. 5 is a flowchart of a method of digitizing an analog input signal using a duty-cycle-controlled input signal path in accordance with an aspect of the disclosure.

Implementations of the present disclosure and their advantages are best understood by referring to the detailed description that follows. It should be appreciated that like reference numerals are used to identify like elements illustrated in one or more of the figures.

DETAILED DESCRIPTION

Figure 1:
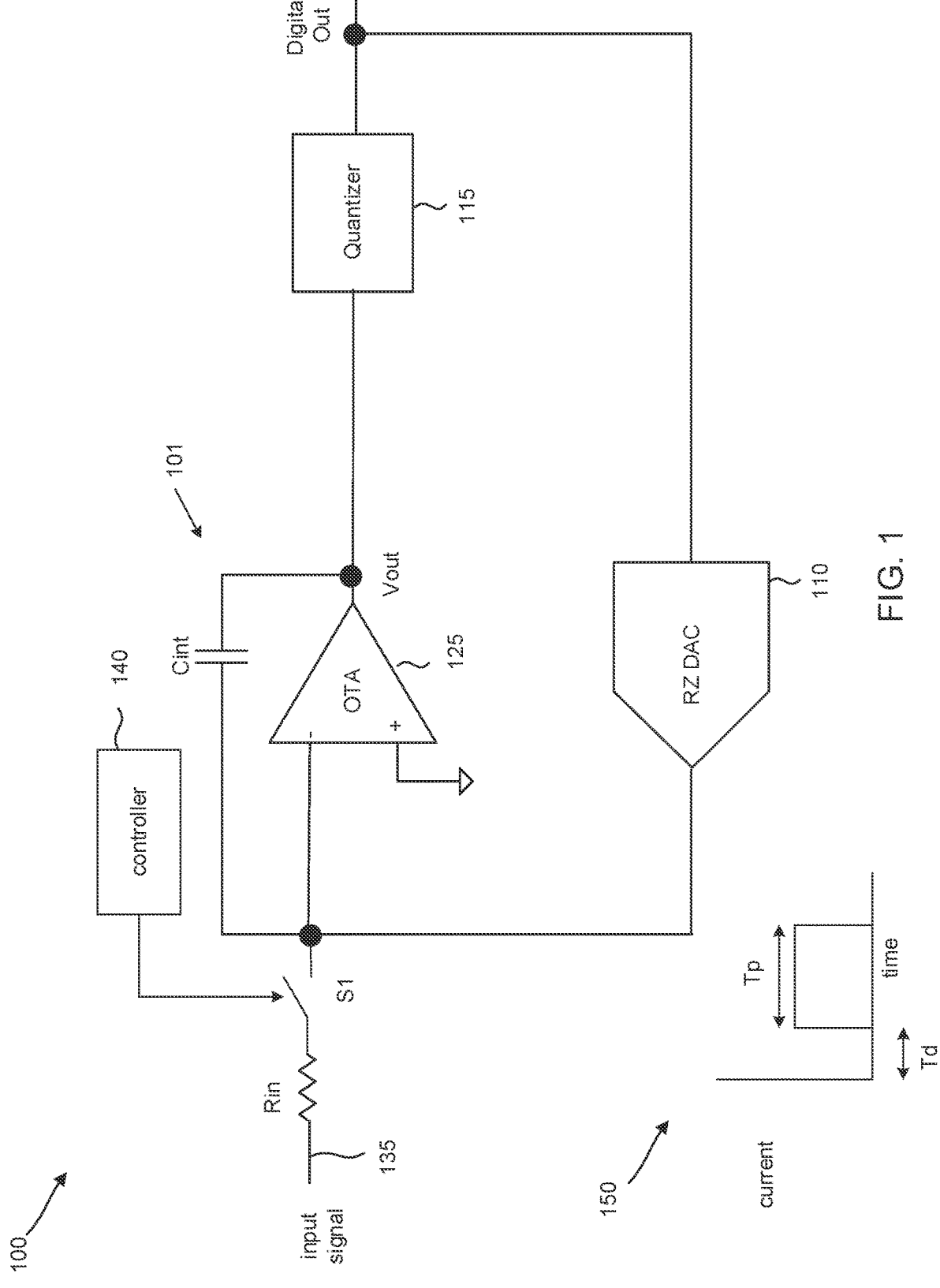
FIG. 1 is a diagram of an example continuous-time delta-sigma analog-to-digital converter with a duty-cycle-controlled input signal path and a return-to-zero digital-to-analog converter in accordance with an aspect of the disclosure.

As implied by the delta-sigma designation, a delta-sigma ADC includes an integration stage (the sigma) that integrates a difference signal (the delta) formed by a difference between an input signal and a feedback signal. A current digital-to-analog converter (IDAC) converts a digital output signal of the ADC to produce an analog feedback signal. To reduce jitter sensitivity from an external clock source, it is advantageous to form the DAC as a return-to-zero (RZ) DAC that pulses the feedback signal according to an integration pulse width (Tp) within a cycle of a DAC clock signal such as generated by a low-noise pulse generator. The feedback signal is not pulsed during an off time (Td). A period of the DAC clock signal thus equals a sum of Tp and Td with the feedback duty cycle equaling a ratio of Tp/(Tp+Td). Alternatively, the jitter sensitivity may be reduced by implementing the DAC as a capacitive DAC in which the feedback signal is also zero during the off time and transiently pulsed relatively high at the start of the integration pulse width to then decay to zero within each cycle of the DAC clock signal. The continuous-time integration is also advantageous with respect to reducing jitter sensitivity.

In a continuous-time delta-sigma ADC, the integration stage is typically formed by an operational transconductance amplifier (OTA) with an integrating capacitor coupled between a first input terminal of the OTA and an output terminal of the OTA. A second input terminal of the OTA couples to ground. The OTA will thus function to keep a voltage of the first input terminal equaling a virtual ground. For example, the first input terminal may be an inverting input terminal with the OTA having its non-inverting input terminal coupled to ground. An input signal path formed by a node for an input signal in series with an input resistor couples to the first input terminal of the OTA. Similarly, a feedback signal path formed by an output terminal of the feedback DAC couples to the first input terminal of the OTA. A quantizer such as a successive-approximation register (SAR) quantizer quantizes an integrated signal from the integration stage (or stages) to form the digital output signal of the ADC.

Although continuous-time delta-sigma ADCs have advantageous properties such as architectural benefits, low jitter, and inherent rejection of aliasing, note that the input signal propagation through the input signal path is continuous whereas the feedback signal propagation through the feedback path is discontinuous regardless of whether the DAC is a return-to-zero DAC or a capacitive DAC. For example, an input current into the integrating capacitor will rapidly swing in polarity when the return-to-zero DAC begins pulsing the feedback current at the beginning of the integration pulse width. The resulting difference between the conduction on the input signal path and on the feedback signal path must be accommodated by the OTA. The OTA may then be subject to slewing and result in a nonlinear degradation of the OTA performance and relatively high OTA output voltage swing, particularly when the input signal is relatively large. The resulting nonlinearity of the OTA may degrade the ADC's signal-to-noise ratio (SNR). Should instead the DAC be implemented as a capacitive DAC, the relatively high transient peak at the beginning of each integration pulse width may result in a disturbance of the virtual ground at the inverting input terminal of the OTA. This disturbance in the virtual ground may in turn contaminate the input signal due to the coupling of the input signal through the input resistor to the virtual ground of the OTA, which may again result in a lowering of the ADC SNR.

To advantageously improve the ADC SNR regardless of whether the feedback DAC is implemented as a return-to-zero DAC or a capacitive DAC, a continuous-time delta-sigma ADC is disclosed in which the input signal path includes an input path switch that is cycled responsive to the duty cycle of the integration pulse width. Should the feedback DAC be a return-to-zero DAC, the duty cycle control of the input path switch is aligned with the integration pulse width such that the input signal path is only conductive during the integration pulse width. In this fashion, the input current into the integrating capacitor is effectively zero during the entire clock cycle. The current conducted by the OTA is thus not subjected to excessive slew and an output signal of the OTA is not subjected to excessive swing so as to advantageously improve the SNR.

Should instead the feedback DAC be a capacitive DAC, the duty cycle control of the input signal path is opposed to the integration pulse width such that the input signal path is only conductive during the off time and not during integration pulse width. The disturbance to the virtual ground of the OTA is thus prevented from disturbing the input signal because the input path switch is open while a feedback current from the capacitive DAC is transiently pulsed high. The lowering of the ADC SNR from the disturbance of the input signal that would otherwise occur is thus prevented so as to improve the ADC SNR. Some ADCs including a return-to-zero DAC will now be discussed in more detail followed by a discussion of some ADCs including a capacitive DAC.

An example continuous-time delta-sigma ADC 100 including a return-to-zero DAC 110 is shown in FIG. 1. A node 135 for an input signal to be digitized couples through an input resistor Rin and a switch S1 to a first input terminal of an OTA 125 to form a duty-cycle-controlled input signal path in which the switch S1 is controlled by a controller 140. A second input terminal of the OTA 125 couples to ground. In one implementation, the first input terminal of the OTA 125 is an inverting input terminal whereas its second input terminal is a non-inverting input terminal, but it will be appreciated that the inverting and non-inverting input terminals may be reversed in alternative implementations.

To complete a continuous-time integration stage 101, an integrating capacitor Cint couples between the inverting input terminal of the OA 125 and an output terminal of the OTA 125. An output signal from the continuous-time integration stage 101 may be further integrated in, for example, a $2^{nd}$ stage discrete-time integration stage (not illustrated) before an integrated signal from the integration stage(s) is quantized by a quantizer 115 such as a SAR quantizer to form a digital output signal (Digital Out). A return-to-zero DAC 110 converts the digital output signal into a feedback signal such as a feedback current that is coupled to the inverting input terminal of the OTA 125.

The return-to-zero DAC pulses the feedback current as shown in the plot 150. In each cycle of a DAC clock cycle, the feedback current is zero for an off time Td of the clock cycle and then pulsed at a constant value for an integration pulse width Tp of a remainder of the clock cycle before returning to zero. A period of the clock cycle thus equals a sum of Td and Tp with a ratio of Tp/(Td+Tp) determining the duty cycle of the feedback current pulsing. To keep a current into the integration capacitor Cint approximately zero during the entire clock period, the controller 140 controls the switch S1 to be closed only during the integration pulse width Tp and to be open during the off time Td. An SNR of the delta-sigma continuous-time ADC 100 is thus advantageously enhanced by the duty cycle control of the switch S1 in the input signal path.

Figure 2:
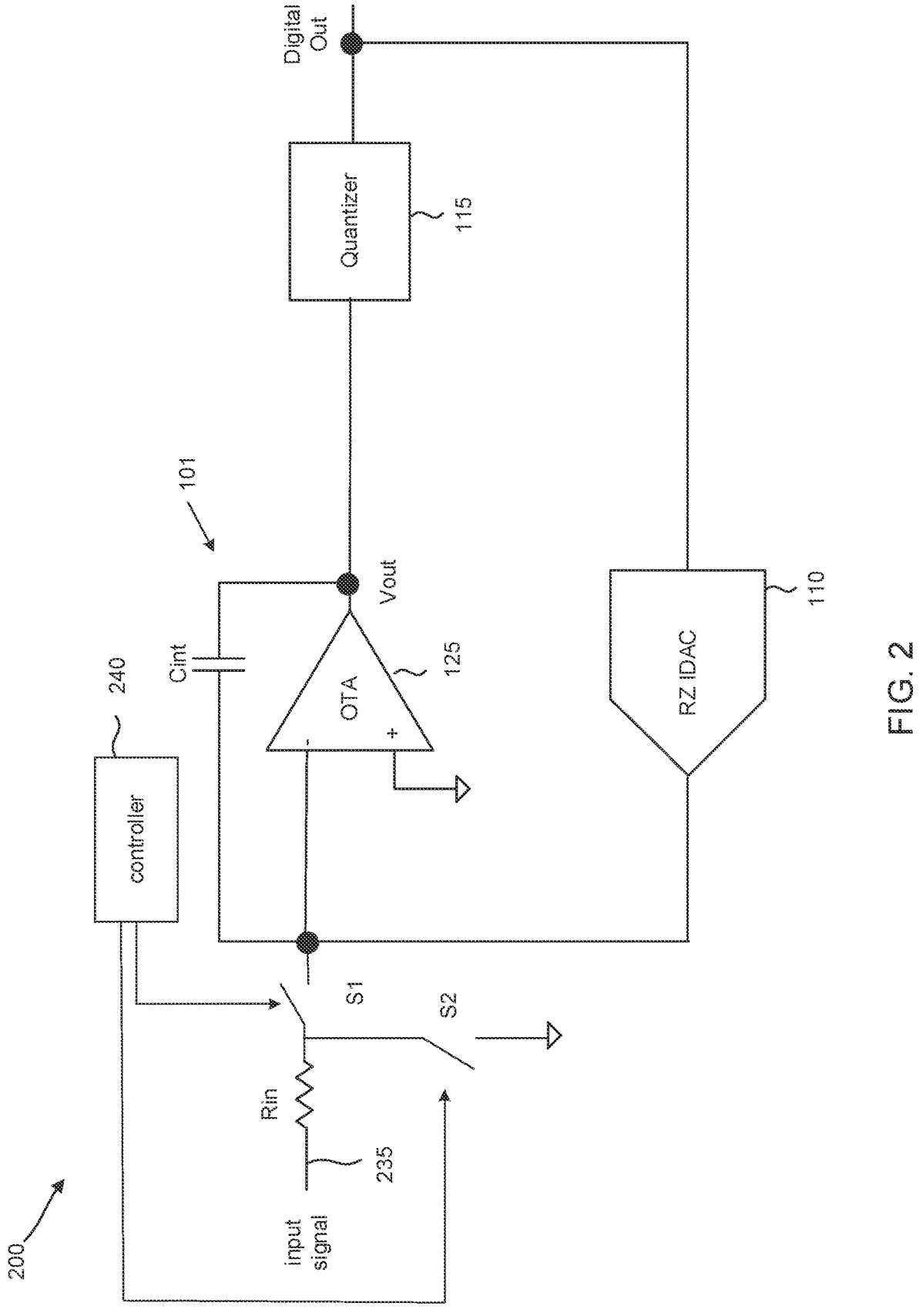
FIG. 2 illustrates a modification of the example continuous-time delta-sigma analog-to-digital converter of FIG. 1 so that a constant input current conducts through the input signal path in accordance with an aspect of the disclosure.

Although the SNR enhancement by the duty-cycle control of the input signal path in the ADC 100 is advantageous, note that an input signal source (not illustrated) that supplies the input signal may be disturbed by the discontinuous loading of the input signal source due to the cycling of the switch S1. A continuous-time delta-sigma ADC 200 including the return-to-zero DAC 110 is shown in FIG. 2 that maintains a constant input signal current from the node 135 for the input signal through the input resistor Rin. The continuous-time integration stage 101 including the OTA 125 and the integration capacitor Cint, switch S1, quantizer 115, and RZ DAC 110 are arranged as discussed for ADC 100. A controller 240 controls the switch S1 to be closed only during the integration pulse width Tp as discussed for the controller 140. But to maintain a constant input current through the input resistor Rin and thus maintain a constant loading of the input signal source, a terminal of the input resistor Rin may couple through a switch S2 to ground. The controller 240 closes switch S2 during the off time Td and opens it during the integration pulse width Tp. A constant input current may thus conduct through the input resistor Rin during the off time Td to ground through switch S2 and during the integration pulse width Tp to the virtual ground of the inverting input terminal of the OTA 125 through switch S1. In this fashion, the input signal source drives a constant load during the DAC clock cycle regardless of whether it is during the off time Td or during the integration pulse width Tp. Some example ADCs including a capacitive DAC will now be discussed in more detail.

Figure 3:
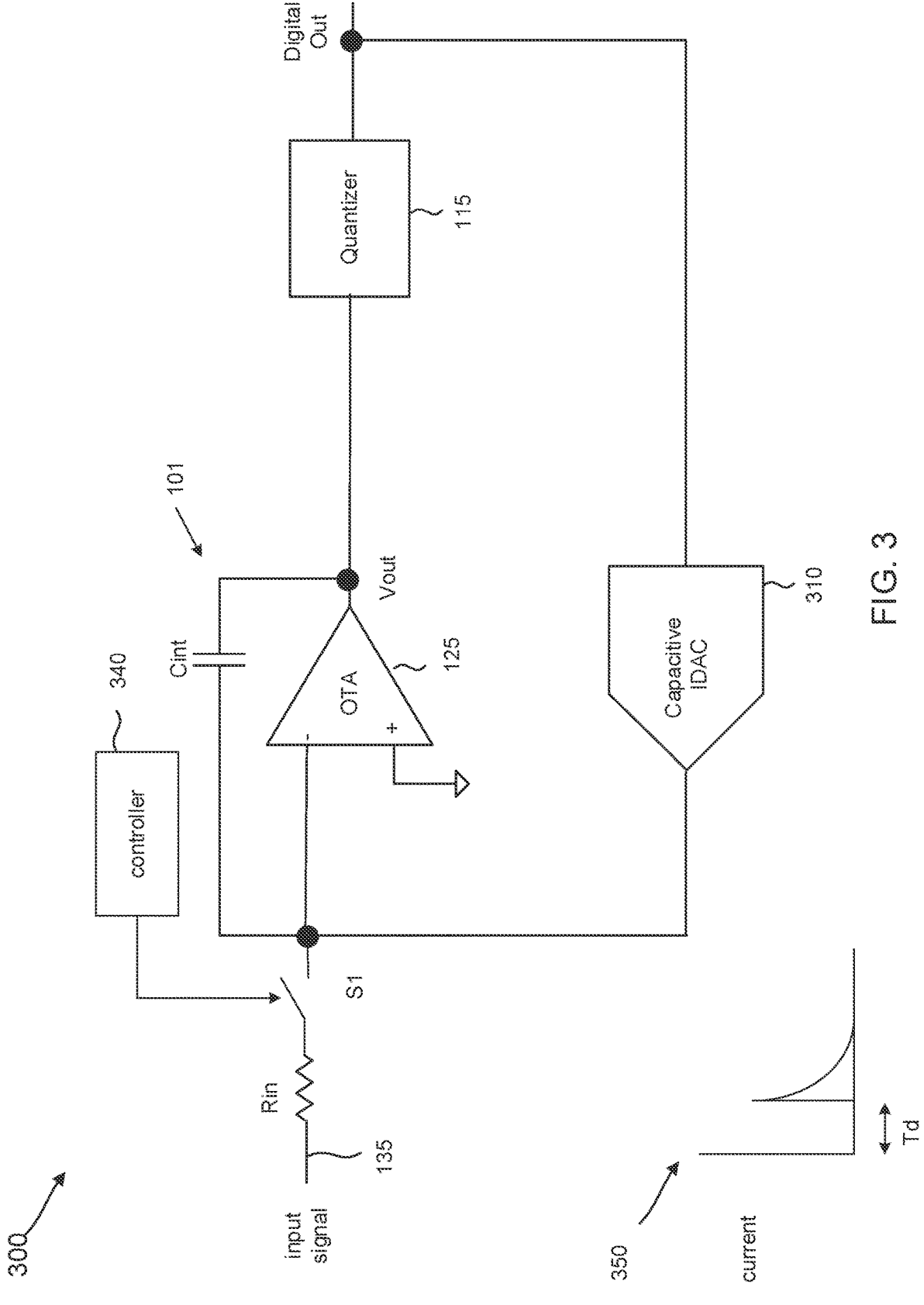
FIG. 3 is a diagram of an example continuous-time delta-sigma analog-to-digital converter with a duty-cycle-controlled input signal path and a capacitive digital-to-analog converter in accordance with an aspect of the disclosure.

An example continuous-time delta-sigma ADC 300 including a capacitive DAC 310 is shown in FIG. 3. As discussed for the ADC 100, the node 135 for the input signal to be digitized couples through the input resistor Rin and a switch S1 to a first input terminal of the OTA 125 to form a duty-cycle-controlled input signal path. A controller 340 controls the switch S1. The continuous-time integration stage 101 including the OTA 125 and the integration capacitor Cint, and the quantizer 115 are arranged as discussed for the ADC 100. In ADC 300, the capacitive DAC 310 converts the digital output signal into a feedback current that is driven to the inverting input terminal of the OTA 125.

FIG. 3 also illustrates a plot 350 of the feedback current for a DAC clock cycle. During the off time Td, the feedback current is zero but then pulses transiently high following a termination of the off time Td and then decays back to zero during the integration pulse width of the clock period. To prevent the spiking of the feedback current and the resulting disturbance of the virtual ground at the inverting input terminal of the OTA from possibly disturbing the input signal, the controller 340 controls the switch S1 to be closed during the off time Td and open during the remainder of the clock period. With switch S1 open while the feedback current peaks, any disturbance of the virtual ground at the inverting input terminal is prevented from disturbing the input signal so as to improve the SNR of the ADC 300.

Figure 4:
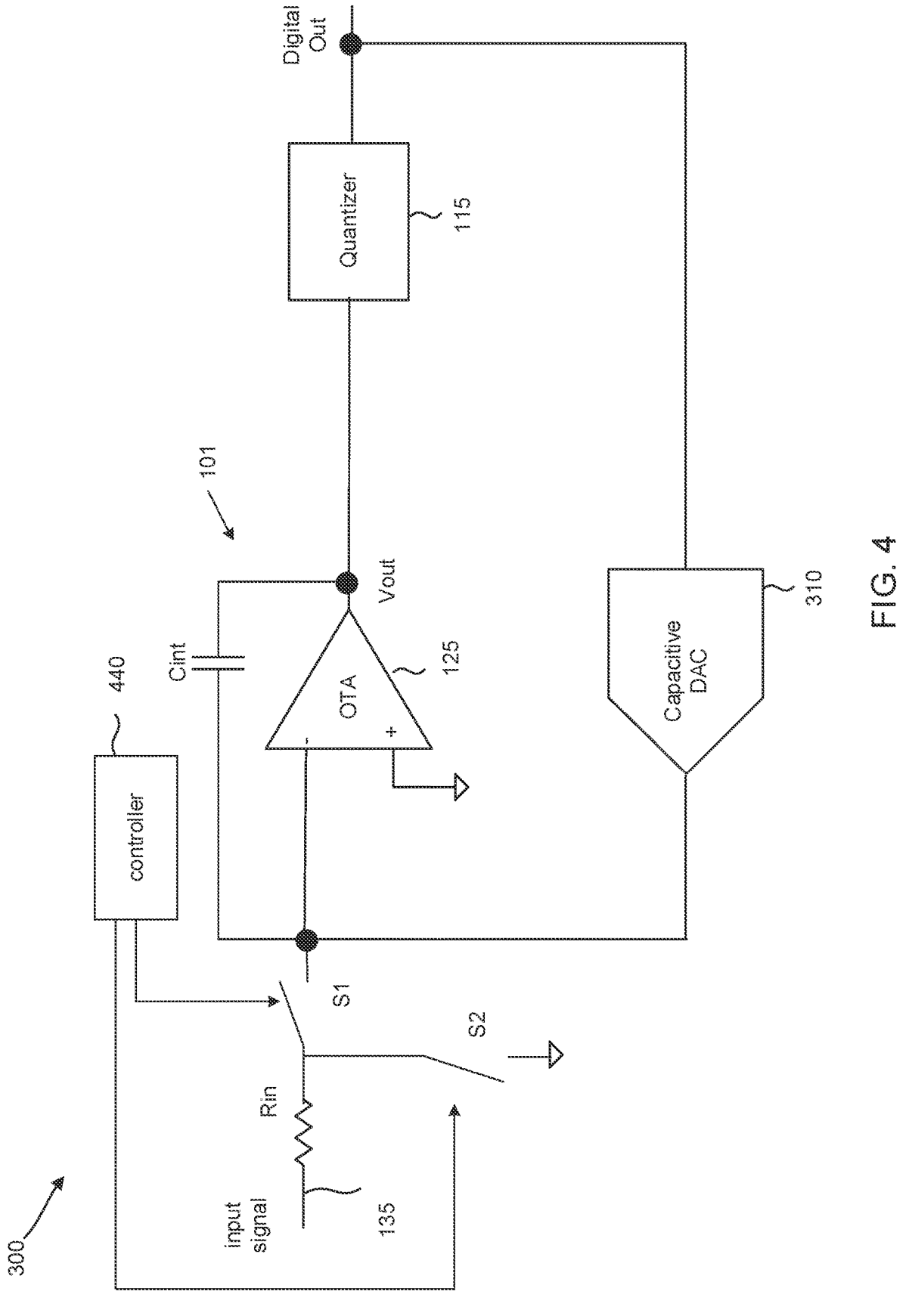
FIG. 4 illustrates a modification of the example continuous-time delta-sigma analog-to-digital converter of FIG. 3 so that a constant input current conducts through the input signal path in accordance with an aspect of the disclosure.

Although the duty-cycle control of the switch S1 by the controller 340 prevents the transient spiking of the feedback current from affecting the input signal, an input signal source (not illustrated) may be disturbed by the resulting discontinuous loading of the input signal path caused by the opening and closing of the switch S1. A continuous-time delta-sigma ADC 400 including the capacitive DAC 310 is shown in FIG. 4 that maintains a constant input signal current from the node 135 for the input signal through the input resistor Rin. As discussed for the ADC 300, the node 135 for the input signal to be digitized couples through the input resistor Rin and the switch S1 to the inverting input terminal of the OTA 125. The continuous-time integration stage 101 including the OTA 125 and the integration capacitor Cint, the quantizer 115, and the capacitive DAC 310 are also arranged as discussed for the ADC 300. A controller 440 controls the switch S1 to be closed only during the off time Td as discussed for the controller 340. But to maintain a constant input current through the input resistor Rin and thus maintain a constant loading of the input signal source, a terminal of the input resistor Rin couples through a switch S2 to ground. The controller 440 opens switch S2 during the off time Td and closes during the remainder of the clock cycle. A constant input current may thus conduct through the input resistor Rin and switch S1 during the off time Td to the virtual ground of the inverting input terminal of the OTA 125 and to conduct through the input resistor Rin and the switch S2 to ground during the remainder of the clock cycle. In this fashion, the input signal source drives a constant load during each clock cycle regardless of whether it is during the off time Td or during the integration pulse width Tp.

An example method of digitizing an analog input signal will now be discussed with reference to the flowchart of FIG. 5. The method includes an act 500 of gating an input current responsive to a duty cycle of a clock signal to form a gated input current. The gating of the input current by switch S1 in any of the ADCs 100, 200, 300, or 400 is an example of act 500. The method further includes an act 505 of integrating a difference between the gated input current and a feedback current to form an integrated output signal. The integration by the continuous-time integration stage 101 in any of the ADCs 100, 200, 300, or 400 is an example of act 505. The method further includes an act 510 of quantizing the integrated output signal to form a digital output signal. The quantization by the quantizer 115 in any of the ADCs 100, 200, 300, or 400 is an example of act 510. Finally, the method includes an act 515 of converting the digital output signal in a digital-to-analog converter responsive to the clock signal to form the feedback current. The conversion by the RZ DAC 110 or by the capacitive DAC 310 is an example of act 515.

Figure 6:
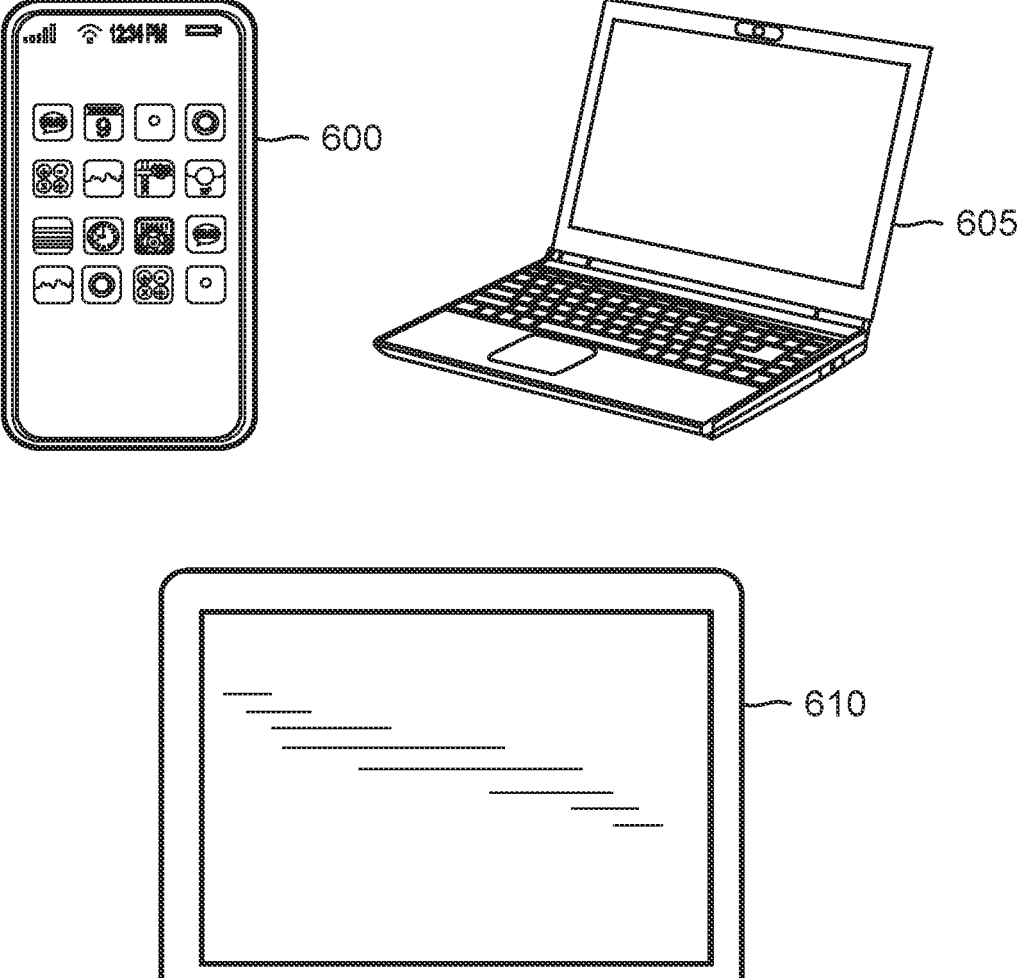
FIG. 6 illustrates some example electronic systems including an analog-to-digital converter in accordance with an aspect of the disclosure.

An analog-to-digital converter with a duty-cycle-controlled input signal path as disclosed herein may be incorporated in a wide variety of electronic systems. For example, as shown in FIG. 6, a cellular telephone 600, a laptop computer 605, and a tablet PC 610 may all include an analog-to-digital converter that functions in accordance with the disclosure. Other exemplary electronic systems such as an earbud, a music player, a video player, a communication device, and a personal computer may also be configured with an analog-to-digital converter constructed in accordance with the disclosure.

The disclosure will now be summarized through the following example clauses:

Clause 1. A continuous-time delta-sigma analog-to-digital converter, comprising:
an input signal node for an analog input signal;
a continuous-time integration stage including a first input terminal;
an input resistor coupled to the input signal node;
a first switch coupled between the input resistor and the first input terminal;
a return-to-zero digital-to-analog converter configured to pulse a feedback current to the first input terminal; and
a controller configured to switch the first switch responsive to an integration pulse width of the feedback current.

Clause 2. The continuous-time delta-sigma analog-to-digital converter of clause 1, wherein the controller is configured to switch on the first switch during the integration pulse width and to switch off the first switch during an off time of the feedback current.

Clause 3. The continuous-time delta-sigma analog-to-digital converter of any of clauses 1-2, wherein the continuous-time integration stage includes an operational transconductance amplifier having the first input terminal and having a second input terminal coupled to ground.

Clause 4. The continuous-time delta-sigma analog-to-digital converter of clause 3, wherein the first input terminal is an inverting input terminal and the second input terminal is a non-inverting input terminal.

Clause 5. The continuous-time delta-sigma analog-to-digital converter of any of clauses 3-4, wherein the continuous-time integration stage includes a capacitor coupled between the first input terminal and an output terminal of the operational transconductance amplifier.

Clause 6. The continuous-time delta-sigma analog-to-digital converter of any of clauses 1-5, further comprising:
a quantizer configured to quantize an integrated output signal from the continuous-time integration stage to form a digital output signal, wherein the return-to-zero digital-to-analog converter is configured to convert the digital output signal to form the feedback current.

Clause 7. The continuous-time delta-sigma analog-to-digital converter of clause 2, further comprising:
a second switch coupled between the first input terminal and ground.

Clause 8. The continuous-time delta-sigma analog-to-digital converter of clause 7, wherein the controller is further configured to switch off the second switch during the integration pulse width and to switch on the second switch during the off time of the feedback current.

Clause 9. The continuous-time delta-sigma analog-to-digital converter of clause 6, wherein the quantizer is a successive-approximation-register quantizer, and wherein the continuous-time delta-sigma analog-to-digital converter is included within a cellular telephone.

Clause 10. A continuous-time delta-sigma analog-to-digital converter, comprising:
an input signal node for an analog input signal;
a continuous-time integration stage including a first input terminal;
an input resistor coupled to the input signal node;
a first switch coupled between the input resistor and the first input terminal;
a capacitive digital-to-analog converter configured to transiently pulse a feedback current to the first input terminal during an integration pulse width of a clock signal; and
a controller configured to switch the first switch on during an off time of the clock signal and to switch the first switch off during the integration pulse width.

Clause 11. The continuous-time delta-sigma analog-to-digital converter of clause 10, wherein the continuous-time integration stage includes an operational transconductance amplifier having the first input terminal and having a second input terminal coupled to ground.

Clause 12. The continuous-time delta-sigma analog-to-digital converter of clause 11, wherein the first input terminal is an inverting input terminal and the second input terminal is a non-inverting input terminal.

Clause 13. The continuous-time delta-sigma analog-to-digital converter of any of clauses 11-12, wherein the continuous-time integration stage includes a capacitor coupled between the first input terminal and an output terminal of the operational transconductance amplifier.

Clause 14. The continuous-time delta-sigma analog-to-digital converter of any of clauses 10-13, further comprising:
a quantizer configured to quantize an integrated output signal from the continuous-time integration stage to form a digital output signal, wherein the capacitive digital-to-analog converter is configured to convert the digital output signal to form the feedback current.

Clause 15. The continuous-time delta-sigma analog-to-digital converter of clause 14, wherein the quantizer is a successive-approximation-register quantizer.

Clause 16. The continuous-time delta-sigma analog-to-digital converter of any of clauses 10-15, further comprising:
a second switch coupled between the first input terminal and ground.

Clause 17. The continuous-time delta-sigma analog-to-digital converter of clause 16, wherein the controller is further configured to switch on the second switch during the off time and to switch on the second switch during the integration pulse width.

Clause 18. A method of digitizing an input current, comprising:
gating an input current responsive to a duty cycle of a clock signal to form a gated input current;
integrating a difference between the gated input current and a feedback current to form an integrated output signal;
quantizing the integrated output signal to form a digital output signal; and converting the digital output signal in a digital-to-analog converter responsive to the clock signal to form the feedback current.

Clause 19. The method of clause 18, wherein gating the input current comprises switching off an input switch for the input current during an off time of the clock cycle and switching on the input switch during an integration pulse width of the clock cycle, and wherein converting the digital output signal in the digital-to-analog converter comprises converting the digital output signal in a return-to-zero digital-to-analog converter.

Clause 20. The method of clause 18, wherein gating the input current comprises switching on an input switch for the input current during an off time of the clock cycle and switching off the input switch during an integration pulse width of the clock cycle, and wherein converting the digital output signal in the digital-to-analog converter comprises converting the digital output signal in a capacitive digital-to-analog converter.

As those of some skill in this art will by now appreciate and depending on the particular application at hand, many modifications, substitutions and variations can be made in and to the materials, apparatus, configurations and methods of use of the devices of the present disclosure without departing from the scope thereof as defined by the appended claims. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:
1. A continuous-time delta-sigma analog-to-digital converter, comprising:
an input signal node for an analog input signal;
a continuous-time integration stage including a first input terminal;
an input resistor coupled to the input signal node;
a first switch coupled between the input resistor and the first input terminal;
a return-to-zero digital-to-analog converter configured to pulse a feedback current to the first input terminal; and
a controller configured to switch the first switch responsive to an integration pulse width of the feedback current; and
a second switch coupled between the first input terminal and ground, wherein the controller is configured to switch on the first switch and switch off the second switch during the integration pulse width.

2. The continuous-time delta-sigma analog-to-digital converter of claim 1, wherein the controller is configured to switch off the first switch and switch on the second switch during an off time of the feedback current.

3. The continuous-time delta-sigma analog-to-digital converter of claim 1, wherein the continuous-time integration stage includes an operational transconductance amplifier having the first input terminal and having a second input terminal coupled to ground.

4. The continuous-time delta-sigma analog-to-digital converter of claim 3, wherein the first input terminal is an inverting input terminal and the second input terminal is a non-inverting input terminal.

5. The continuous-time delta-sigma analog-to-digital converter of claim 3, wherein the continuous-time integration stage includes a capacitor coupled between the first input terminal and an output terminal of the operational transconductance amplifier.

6. The continuous-time delta-sigma analog-to-digital converter of claim 1, further comprising:

a quantizer configured to quantize an integrated output signal from the continuous-time integration stage to form a digital output signal, wherein the return-to-zero digital-to-analog converter is configured to convert the digital output signal to form the feedback current.

7. The continuous-time delta-sigma analog-to-digital converter of claim 1, wherein the first switch is coupled between the second switch and the first input terminal.

8. The continuous-time delta-sigma analog-to-digital converter of claim 1, wherein the first switch is coupled between the second switch and the first input terminal.

9. The continuous-time delta-sigma analog-to-digital converter of claim 6, wherein the quantizer is a successive-approximation-register quantizer, and wherein the continuous-time delta-sigma analog-to-digital converter is included within a cellular telephone.

10. A continuous-time delta-sigma analog-to-digital converter, comprising:

an input signal node for an analog input signal;

a continuous-time integration stage including a first input terminal;

an input resistor coupled to the input signal node;

a first switch coupled between the input resistor and the first input terminal;

a capacitive digital-to-analog converter configured to transiently pulse a feedback current to the first input terminal during an integration pulse width of a clock signal; and a controller configured to switch the first switch on during an off time of the clock signal and to switch the first switch off during the integration pulse width;

a second switch coupled between the first input terminal and ground, wherein the controller is further configured to switch off the second switch during the off time and to switch on the second switch during the integration pulse width.

11. The continuous-time delta-sigma analog-to-digital converter of claim 10, wherein the continuous-time integration stage includes an operational transconductance amplifier having the first input terminal and having a second input terminal coupled to ground.

12. The continuous-time delta-sigma analog-to-digital converter of claim 11, wherein the first input terminal is an inverting input terminal and the second input terminal is a non-inverting input terminal.

13. The continuous-time delta-sigma analog-to-digital converter of claim 11, wherein the continuous-time integration stage includes a capacitor coupled between the first input terminal and an output terminal of the operational transconductance amplifier.

14. The continuous-time delta-sigma analog-to-digital converter of claim 10, further comprising:

a quantizer configured to quantize an integrated output signal from the continuous-time integration stage to form a digital output signal, wherein the capacitive digital-to-analog converter is configured to convert the digital output signal to form the feedback current.

15. The continuous-time delta-sigma analog-to-digital converter of claim 14, wherein the quantizer is a successive-approximation-register quantizer.

16. The continuous-time delta-sigma analog-to-digital converter of claim 10 wherein the first switch is coupled between the second switch and the capacitive digital-to-analog converter.

17. The continuous-time delta-sigma analog-to-digital converter of claim 10, wherein the first switch is coupled between the second switch and the first input terminal.

18. A method of digitizing an input current, comprising:

gating an input current responsive to a duty cycle of a clock signal to form a gated input current, wherein gating the input current comprises coupling the input current to ground through an input resistor during a portion of the clock cycle;

integrating a difference between the gated input current and a feedback current to form an integrated output signal;

quantizing the integrated output signal to form a digital output signal; and converting the digital output signal in a digital-to-analog converter responsive to the clock signal to form the feedback current.

19. The method of claim 18, wherein gating the input current comprises switching off an input switch for the input current during an off time of the clock cycle and switching on the input switch during an integration pulse width of the clock cycle, and wherein converting the digital output signal in the digital-to-analog converter comprises converting the digital output signal in a return-to-zero digital-to-analog converter.

20. The method of claim 18, wherein gating the input current comprises switching on an input switch for the input current during an off time of the clock cycle and switching off the input switch during an integration pulse width of the clock cycle, and wherein converting the digital output signal in the digital-to-analog converter comprises converting the digital output signal in a capacitive digital-to-analog converter.

* * * * *